US009520904B2

United States Patent
Horne et al.

(10) Patent No.: US 9,520,904 B2
(45) Date of Patent: Dec. 13, 2016

(54) APPARATUS AND METHOD FOR HIGH LINEARITY TUNING

(71) Applicant: BlackBerry Limited, Waterloo (CA)

(72) Inventors: Edward Horne, Burlington (CA); Daniel Charles Boire, Nashua, NH (US); Matthew Russell Greene, Crystal Lake, IL (US); James Oakes, Westford, MA (US)

(73) Assignee: BlackBerry Limited, Waterloo, ON (CA)

( * ) Notice: Subject to any disclaimer, the term of this patent is extended or adjusted under 35 U.S.C. 154(b) by 39 days.

(21) Appl. No.: 14/078,686

(22) Filed: Nov. 13, 2013

(65) Prior Publication Data

US 2015/0133064 A1    May 14, 2015

(51) Int. Cl.

| | |
|---|---|
| H04B 1/04 | (2006.01) |
| H04B 1/38 | (2015.01) |
| H04B 1/40 | (2015.01) |
| H04B 1/18 | (2006.01) |
| H03H 7/40 | (2006.01) |
| H04B 1/3822 | (2015.01) |
| H04B 1/403 | (2015.01) |

(52) U.S. Cl.
CPC .............. *H04B 1/0458* (2013.01); *H03H 7/40* (2013.01); *H04B 1/18* (2013.01); *H04B 1/3822* (2013.01); *H04B 1/40* (2013.01); *H04B 1/406* (2013.01)

(58) Field of Classification Search
CPC combination set(s) only.
See application file for complete search history.

(56) References Cited

U.S. PATENT DOCUMENTS

| | | | | |
|---|---|---|---|---|
| 2004/0104740 | A1* | 6/2004 | Burns et al. .................. | 324/763 |
| 2008/0164956 | A1* | 7/2008 | Gailus ....................... | H03J 3/20 |
| | | | | 331/117 R |
| 2010/0090760 | A1* | 4/2010 | Bachmann .............. | H01L 29/93 |
| | | | | 327/586 |
| 2011/0053524 | A1* | 3/2011 | Manssen .............. | H04B 1/0458 |
| | | | | 455/77 |

(Continued)

FOREIGN PATENT DOCUMENTS

EP    2590190 A2    5/2013

OTHER PUBLICATIONS

Chen, L-YV, Roger Forse, D. Chase, and Robert A. York. "Analog tunable matching network using integrated thin-film BST capacitors." In Microwave Symposium Digest, 2004 IEEE MTT-S International, vol. 1, pp. 261-264. IEEE, 2004.*

(Continued)

*Primary Examiner* — Ankur Jain
*Assistant Examiner* — Zhitong Chen
(74) *Attorney, Agent, or Firm* — Guntin & Gust, PLC; Jay H. Anderson

(57) ABSTRACT

A system that incorporates teachings of the subject disclosure may include, for example, a plurality of variable capacitors, a first set of resistors for applying a bias voltage to each variable capacitor of the plurality of capacitors, and a second set of resistors for providing a DC ground to each variable capacitor of the plurality of capacitors. The system can include one or more of multiple bias points, anti-parallel diodes, a choke inductor or a ground inductor. Other embodiments are disclosed.

18 Claims, 12 Drawing Sheets

(56) References Cited

U.S. PATENT DOCUMENTS

2012/0154975 A1\* 6/2012 Oakes .................... H01G 4/33
  361/301.4
2012/0212304 A1\* 8/2012 Zhang ................. H03H 7/0153
  333/174
2012/0214421 A1 8/2012 Hoirup et al.

OTHER PUBLICATIONS

Huang, Cong, et al. "Ultra linear low-loss varactor diode configurations for adaptive RF systems." Microwave Theory and Techniques, IEEE Transactions on 57.1 (2009): 205-215.\*
Chen, L-YV, Roger Forse, D. Chase, and Robert A. York. "Analog tunable matching network using integrated thin-film BST capacitors." In Microwave Symposium Digest, 2004 IEEE MTT-S International, vol. 1, pp. 261-264 IEEE, 2004.\*
Buisman, K. et al., "Distortion-Free Vacator Diode Topologies for RF Adaptivity", IEEE, 2005, 4 pages.

\* cited by examiner

LOOK-UP TABLE

| |
|---|
| Band 1; Use Case 1; Desired tuning state |
| Band 1; Use Case 2; Desired tuning state |
| ⋮ |
| Band 1; Use Case n; Desired tuning state |
| Band 2; Use Case 1; Desired tuning state |
| Band 2; Use Case 2; Desired tuning state |
| ⋮ |
| Band 2; Use Case n; Desired tuning state |
| ⋮ |
| Band N; Use Case 1; Desired tuning state |
| Band N; Use Case 2; Desired tuning state |
| ⋮ |
| Band N; Use Case n; Desired tuning state |

APPARATUS AND METHOD FOR HIGH LINEARITY TUNING

FIELD OF THE DISCLOSURE

The subject disclosure relates to an apparatus and method for high linearity tuning.

BACKGROUND

Cellular communication devices such as cellular telephones, tablets, and laptops can support multi-cellular access technologies, peer-to-peer access technologies, personal area network access technologies, and location receiver access technologies, which can operate concurrently. Cellular communication devices have also integrated a variety of consumer features such as MP3 players, color displays, gaming applications, cameras, and other features. Cellular communication devices can be required to communicate at a variety of frequencies, and in some instances are subjected to a variety of physical and functional use conditions.

BRIEF DESCRIPTION OF THE DRAWINGS

Reference will now be made to the accompanying drawings, which are not necessarily drawn to scale, and wherein:

FIG. 7 depicts an illustrative embodiment of a look-up table utilized by the communication device of FIG. 1A for controlling tunable reactive elements utilized by the communication device;

DETAILED DESCRIPTION

Figure 1A:
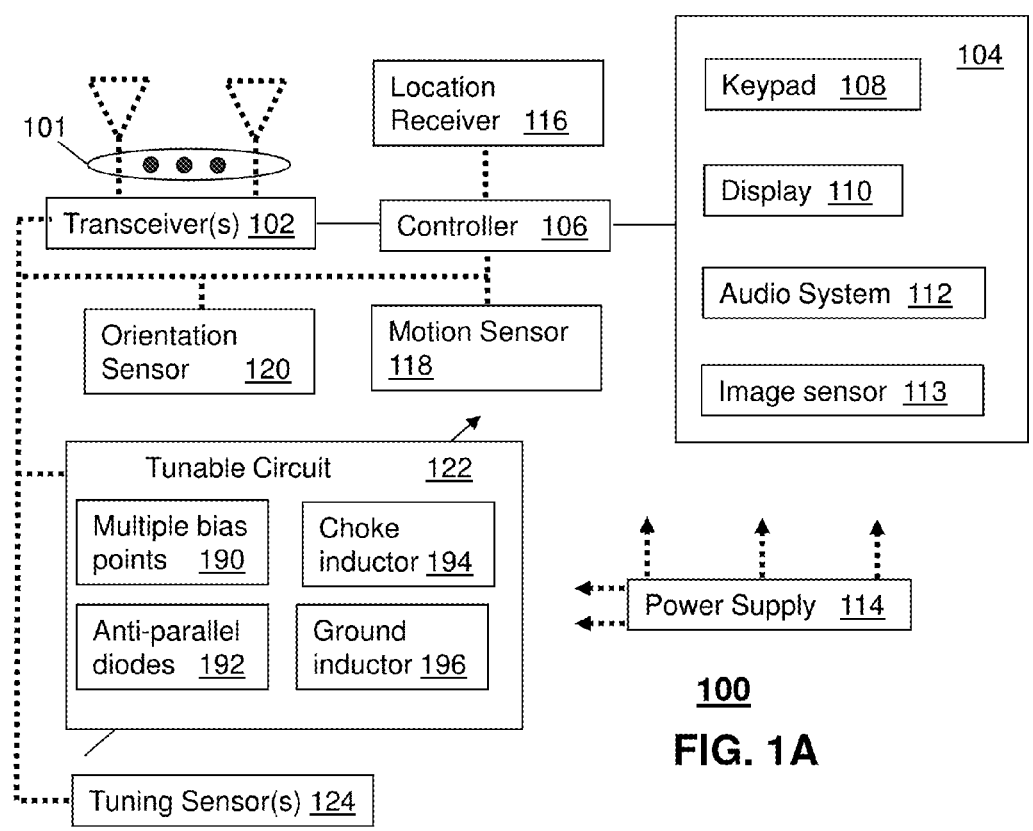
FIGS. 1A-1E depict illustrative embodiments of a communication device that performs high linearity tuning.

The subject disclosure describes, among other things, illustrative embodiments of devices and/or components that provide high linearity, such as during tuning for a mobile communication device. Other devices can also be provided with high linearity tuning, including tunable filters, tunable antennas, or tunable power amplifiers, which may or may not be used with a mobile communication device. One or more of the embodiments can adjust a group of variable capacitors to perform the tuning while satisfying selected performance criteria such as insertion loss and/or response time speed. In one embodiment applied to tuning of a mobile communication device, the group of variable capacitors can be connected in series to reduce non-linear distortion by dividing an RF voltage over all of the capacitors between $RF_{IN}$ and $RF_{OUT}$. In this embodiment, a resistor bias network, such as a string of resistors, can apply the full DC bias voltage to each capacitor.

In one embodiment, the selected performance criteria can be satisfied by utilizing multiple bias points (e.g., two or more) along the resistor bias network where each of the bias points is coupled with a voltage bias source. In one embodiment, the selected performance criteria can be satisfied by utilizing a choke inductor connected between the resistor bias network and the voltage bias source. In one embodiment, the selected performance criteria can be satisfied by utilizing a diode sub-circuit connected between the resistor bias network and the voltage bias source. For example, the diode sub-circuit can include an anti-parallel pair of diodes that is connected between multiple bias points. In one embodiment, the selected performance criteria can be satisfied by utilizing a ground inductor.

Other embodiments are described by the subject disclosure.

One embodiment of the subject disclosure includes a mobile communication device having a transceiver, an antenna coupled with the transceiver, and a matching network coupled with the transceiver and the antenna. The matching network comprises a plurality of variable capacitors connected in series, a first string of resistors for applying a bias voltage to each variable capacitor of the plurality of capacitors, and a second string of resistors for providing a DC ground to each variable capacitor of the plurality of capacitors. The first string of resistors has a first bias point coupled to a voltage bias source via a first feed inductor.

One embodiment of the subject disclosure includes a device having a plurality of variable capacitors connected in series. The device can have a first set of resistors for applying a bias voltage to each variable capacitor of the plurality of variable capacitors. The device can have a second set of resistors for providing a DC ground to each variable capacitor of the plurality of variable capacitors. The first set of resistors has one or more bias points, and the one or more bias points are coupled to a voltage bias source via one or more feed inductors, respectively.

One embodiment of the subject disclosure includes a mobile communication device that has a transceiver, an antenna coupled with the transceiver, and a matching network coupled with the transceiver and the antenna. The matching network can include a plurality of variable capacitors connected in series, a first string of resistors for applying a bias voltage to each variable capacitor of the plurality of capacitors, and a second string of resistors for providing a DC ground to each variable capacitor of the plurality of capacitors. The first string of resistors can have first and second bias points, where the first bias point is coupled to a voltage bias source via a first feed resistor, and where the second bias point is coupled to the voltage bias source via a second feed resistor.

One embodiment of the subject disclosure includes a device having a plurality of variable capacitors connected in series, a first set of resistors for applying a bias voltage to each variable capacitor of the plurality of capacitors, and a second set of resistors for providing a DC ground to each variable capacitor of the plurality of capacitors. The first set of resistors can have first and second bias points, where the first and second bias points are coupled to a voltage bias source via an anti-parallel pair of diodes that is located between the first and second bias points.

One embodiment of the subject disclosure is a method that includes determining, by a system including a processor, a desired insertion loss associated with a tunable component, and determining, by the system, a desired response time speed associated with the tunable component. The method can include connecting a first string of resistors and a second string of resistors with a plurality of variable capacitors connected in series, where the first string of resistors is configured for applying a bias voltage to each variable capacitor of the plurality of capacitors, and where the second string of resistors is configured for providing a DC ground to each variable capacitor of the plurality of capacitors. The method can include connecting a voltage bias source to the first string of resistors at first and second bias points, where positioning of the first and second bias points along the first string of resistors is selected based on the desired insertion loss and the desired response time speed.

FIG. 1A depicts an illustrative embodiment of a communication device 100. The communication device 100 can comprise one or more transceivers 102 coupled to one or more antennas 101 (e.g., each transceiver having transmitter and receiver sections herein described as transceiver 102 or transceivers 102), a tunable circuit 122, one or more tuning sensors 124, a user interface (UI) 104, a power supply 114, a location receiver 116, a motion sensor 118, an orientation sensor 120, and/or a controller 106 for managing operations thereof. The transceiver 102 can support short-range and/or long-range wireless access technologies such as Bluetooth, ZigBee, Wireless Fidelity (WiFi), Digital Enhance Cordless Telecommunications (DECT), or cellular communication technologies, just to mention a few. The communication device 100 can be a multi-mode device capable of providing communication services via various wireless access technologies, including two or more such services simultaneously.

Cellular technologies can include, for example, Global System for Mobile (GSM), Code Division Multiple Access (CDMA), Time Division Multiple Access (TDMA), Universal Mobile Telecommunications (UMTS), World interoperability for Microwave (WiMAX), Software Defined Radio (SDR), Long Term Evolution (LTE), as well as other next generation wireless communication technologies as they arise. The transceiver 102 can also be adapted to support circuit-switched wireline access technologies such as Public Switched Telephone Network (PSTN), packet-switched wireline access technologies such as TCP/IP, Voice over IP-VoIP, etc., or combinations thereof.

The tunable circuit 122 can comprise variable reactive elements such as variable capacitors, variable inductors, or combinations thereof that are tunable with digital and/or analog bias signals. The tunable circuit 122 can represent a tunable matching network coupled to the antenna 101 to compensate for a change in impedance of the antenna 101, a compensation circuit to compensate for mutual coupling in a multi-antenna system, an amplifier tuning circuit to control operations of an amplifier of the transceiver 102, a filter tuning circuit to alter a pass band of a filter used by the transceiver 102, and so on.

In one embodiment, the tunable circuit 122 can include a group of variable capacitors (e.g., voltage tunable capacitors) which are provided with a tuning signal(s) (e.g., a voltage bias signal(s)) through the use of multiple bias (or feed) points 190. The use of the group of variable capacitors (e.g., in series) can reduce non-linear distortion in the tuning. The use of multiple bias points 190 (e.g., two or more), which can be coupled to a voltage bias source (e.g., via a feed resistor) for adjusting the variable capacitors to implement the tuning, can enable achieving or otherwise satisfying thresholds for insertion loss and/or response time speed. In one or more embodiments, sufficient isolation between the bias points 190 can be maintained using additional components and/or by using multiple outputs of a High Voltage Digital-to-Analog Converter (HVDAC). In one embodiment, the particular position of each bias point of the multiple bias points 190 can be selected according to insertion loss and/or response time speed criteria. For example, a set of resistors (e.g., a string of resistors) can be coupled with the group of variable capacitors such that the string of resistors applies a full DC bias voltage to each capacitor of the group of variable capacitors. Nodes between selected pairs of resistors can be chosen for the bias point positions according to the insertion loss and/or the response time speed criteria. For instance, insertion loss and/or response time speed can be measured for different configurations that utilize different bias point locations. Based on the measurements and desired goals for the insertion loss and/or the response time speed, the bias point locations can be chosen. In one embodiment, other criteria can also be used in selecting the bias point locations, including other operational parameters and/or manufacturing considerations. In one embodiment, the resistance values for the feed resistor(s) can be chosen based on various factors including the insertion loss and/or the response time speed criteria.

In one embodiment, the tunable circuit 122 can include the group of variable capacitors (e.g., the voltage tunable capacitors) which are provided with the tuning signal(s) (e.g., the voltage bias signal(s)) through the use of multiple bias (or feed) points 190 and a diode sub-circuit (e.g., anti-parallel diodes 192). The anti-parallel diodes 192 can be positioned between the bias points 190 (e.g., a pair of bias points). During switching the diodes 192 can provide a low impedance path to charge and discharge the group of variable capacitors at a desired speed. In one embodiment, resistors can be utilized with the anti-parallel diodes 192, such as a parallel resistor having a sufficient resistance to provide isolation at RF between a pair of bias points 190 to reduce losses at high frequency and/or a series resistor. The resistance values for the parallel and/or series resistors can be selected based on various factors, such as satisfying insertion loss and/or response time speed criteria. As described above, the particular location of the bias points along the set of resistors (e.g., the string of resistors) can be selected based on various factors, such as satisfying insertion loss and/or response time speed criteria.

In one embodiment, the tunable circuit 122 can include the group of variable capacitors (e.g., the voltage tunable capacitors) which are provided with the tuning signal(s) (e.g., the voltage bias signal(s)) via a choke (or feed) inductor 194 that is positioned between the bias point and the voltage bias source. The choke inductor 194 can improve response time for the group of variable capacitors. In one embodiment, the choke inductor 194 can connect the voltage bias source with the bias point via a small or no feed resistance. In other embodiments, the choke inductor 194 can be in series with a feed resistor. In one or more embodiments, the reduction of resistance of the feed resistor can improve response time but increase insertion loss. In one embodiment, the use of the choke inductor 194 without a feed resistor or with a small resistance (relative to a larger inductance of the choke inductor) can improve response time but maintain insertion loss. The choke inductor 194 can have high impedance at RF but low impedance for charging and discharging the variable capacitors when the voltage bias signal changes. The resistance value for the feed resistor (if utilized) and/or the inductance value of the choke inductor 194 can be selected based on various factors, such as satisfying insertion loss and/or response time speed criteria. In one or more embodiments, multiple choke inductors 194 (with or without feed resistors) can be used with the multiple bias points 190, such as utilizing a first choke inductor connected between the voltage bias source and a first bias point and utilizing a second choke inductor connected between the voltage bias source and a second bias point. In one or more embodiments, any number of bias points can be utilized where each of the bias points may or may not be connected with a choke inductor 194. In another embodiment, each bias point can be connected with a corresponding choke inductor 194. As described above, the particular location of the bias points along the set of resistors (e.g., the string of resistors) can be selected based on various factors, such as satisfying insertion loss and/or response time speed criteria. The choke inductor 194 (and the feed resistor if utilized) can be implemented off-chip or on-chip.

In one embodiment, the tunable circuit 122 can include the group of variable capacitors (e.g., the voltage tunable capacitors) which are provided with a ground path having a ground inductor 196. The use of ground inductor 196 enables a low impedance path to the external DC ground for faster tuning. In one embodiment, a set of resistors (e.g., a string of resistors) coupled with a DC ground can be used to apply the DC ground to all of the capacitors of the group of variable capacitors and thereby speed up the charge and discharge ground paths. This configuration can be used in conjunction with an RF input and/or an RF output (for the matching network that includes the group of variable capacitors) being connected with a DC ground. The ground inductor 196 can be used in the ground path between the string of resistors and the DC ground to reduce losses. In one embodiment, a ground resistor can be placed in series with the ground inductor. The resistance value for the ground resistor (if utilized) and/or the inductance value of the ground inductor 196 can be selected based on various factors, such as satisfying loss criteria. The ground resistor and/or the ground inductor 196 can be provided on-chip or off-chip. In one embodiment, a connection from one of the variable capacitors can be made directly to the NC pad which is not being used. In one or more embodiments, the ground inductor 196 (with or without the ground resistor) can be utilized with diode and/or inductor biasing (such as described above) of the voltage biasing source. In one or more embodiments, multiple ground connections using ground inductors 196 (with or without ground resistors) can be used, such as utilizing a first ground inductor connected between the set of resistors (e.g., a string of resistors) and the DC ground and utilizing a second ground inductor connected between the set of resistors (e.g., the string of resistors) and the DC ground. In one or more embodiments, any number of multiple ground connections can be utilized with the string of resistors where each of the ground connections may or may not be connected with the ground inductor and/or ground resistor. For instance, the number of ground connections can correspond to the number of variable capacitors, the number of pairs of top and bottom capacitors, or some other number including less than the number of capacitors. In another embodiment, each ground connection for the string of resistors can include a corresponding ground inductor 196.

Figure 2:
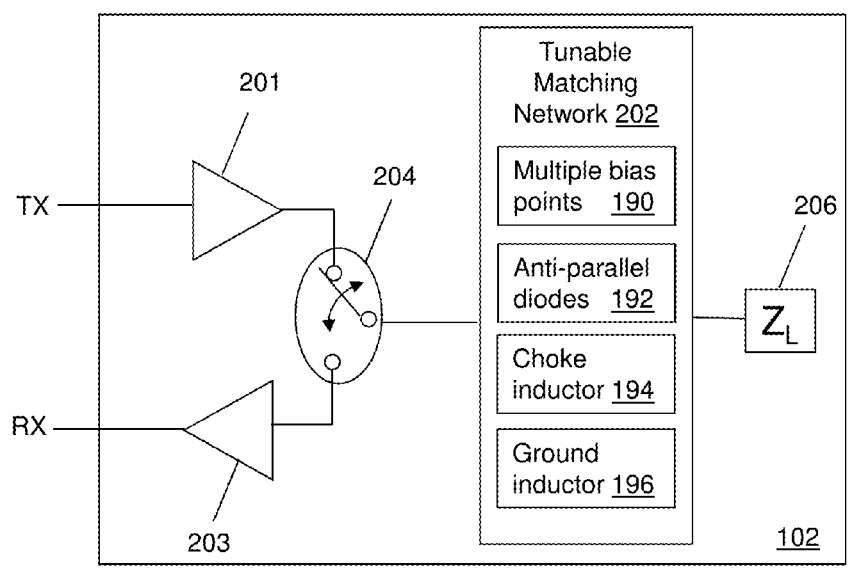
FIG. 2 depicts an illustrative embodiment of a portion of a transceiver of the communication device of FIG. 1A.

The tuning sensors 124 can be placed at any stage of the transceiver 102 such as, for example, before or after a matching network 202, and/or at a power amplifier 201 as shown in FIG. 2. The tuning sensors 124 can utilize any suitable sensing technology such as directional couplers, voltage dividers, or other sensing technologies to measure signals at any stage of the transceiver 102. The digital samples of the measured signals can be provided to the controller 106 by way of analog-to-digital converters included in the tuning sensors 124. Data provided to the controller 106 by the tuning sensors 124 can be used to measure, for example, transmit power, transmitter efficiency, receiver sensitivity, power consumption of the communication device 100, frequency band selectivity by adjusting filter passbands, linearity and efficiency of power amplifiers, specific absorption rate (SAR) requirements, and so on. The controller 106 can be configured to execute one or more tuning algorithms to determine desired tuning states of the tunable circuit 122 based on the foregoing measurements.

The UI 104 can include a depressible or touch-sensitive keypad 108 with a navigation mechanism such as a roller ball, a joystick, a mouse, or a navigation disk for manipulating operations of the communication device 100. The keypad 108 can be an integral part of a housing assembly of the communication device 100 or an independent device operably coupled thereto by a tethered wireline interface (such as a USB cable) or a wireless interface supporting, for example, Bluetooth. The keypad 108 can represent a numeric keypad commonly used by phones, and/or a QWERTY keypad with alphanumeric keys. The UI 104 can further include a display 110 such as monochrome or color LCD (Liquid Crystal Display), OLED (Organic Light Emitting Diode) or other suitable display technology for conveying images to an end user of the communication device 100. In an embodiment where the display 110 is touch-sensitive, a portion or all of the keypad 108 can be presented by way of the display 110 with navigation features.

The display 110 can use touch screen technology to also serve as a user interface for detecting user input. As a touch screen display, the communication device 100 can be adapted to present a user interface with graphical user interface (GUI) elements that can be selected by a user with a touch of a finger. The touch screen display 110 can be equipped with capacitive, resistive or other forms of sensing technology to detect how much surface area of a user's finger has been placed on a portion of the touch screen display. This sensing information can be used to control the manipulation of the GUI elements or other functions of the user interface. The display 110 can be an integral part of the housing assembly of the communication device 100 or an independent device communicatively coupled thereto by a tethered wireline interface (such as a cable) or a wireless interface.

The UI 104 can also include an audio system 112 that utilizes audio technology for conveying low volume audio (such as audio heard in proximity of a human ear) and high volume audio (such as speakerphone for hands free operation). The audio system 112 can further include a microphone for receiving audible signals of an end user. The audio system 112 can also be used for voice recognition applications. The UI 104 can further include an image sensor 113 such as a charged coupled device (CCD) camera for capturing still or moving images.

The power supply 114 can utilize common power management technologies such as replaceable and rechargeable batteries, supply regulation technologies, and/or charging system technologies for supplying energy to the components of the communication device 100 to facilitate long-range or short-range portable applications. Alternatively, or in combination, the charging system can utilize external power sources such as DC power supplied over a physical interface such as a USB port or other suitable tethering technologies.

The location receiver 116 can utilize location technology such as a global positioning system (GPS) receiver capable of assisted GPS for identifying a location of the communication device 100 based on signals generated by a constellation of GPS satellites, which can be used for facilitating location services such as navigation. The motion sensor 118 can utilize motion sensing technology such as an accelerometer, a gyroscope, or other suitable motion sensing technology to detect motion of the communication device 100 in three-dimensional space. The orientation sensor 120 can utilize orientation sensing technology such as a magnetometer to detect the orientation of the communication device 100 (north, south, west, and east, as well as combined orientations in degrees, minutes, or other suitable orientation metrics).

The communication device 100 can use the transceiver 102 to also determine a proximity to or distance to cellular, WiFi, Bluetooth, or other wireless access points by sensing techniques such as utilizing a received signal strength indicator (RSSI) and/or signal time of arrival (TOA) or time of flight (TOF) measurements.

The controller 106 can utilize computing technologies such as a microprocessor, a digital signal processor (DSP), programmable gate arrays, application specific integrated circuits, and/or a video processor with associated storage memory such as Flash, ROM, RAM, SRAM, DRAM or other storage technologies for executing computer instructions, controlling, and processing data supplied by the aforementioned components of the communication device 100.

Other components not shown in FIG. 1 can be used by the subject disclosure. The communication device 100 can include a slot for inserting or removing an identity module such as a Subscriber Identity Module (SIM) card. SIM cards can be used for identifying and registering for subscriber services, executing computer programs, storing subscriber data, and so forth.

Figure 1B:
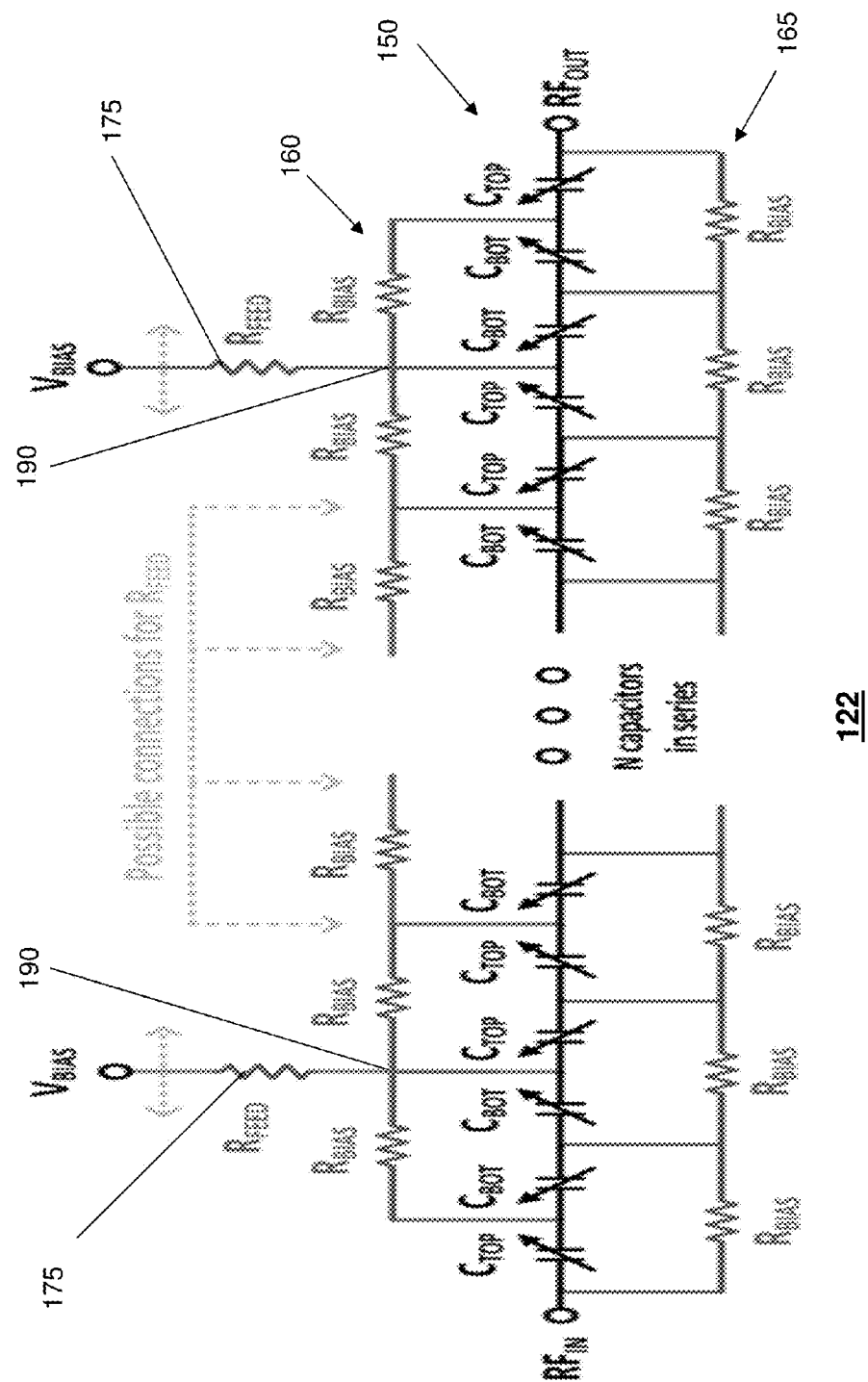

Referring additionally to FIG. 1B, in one embodiment the tunable circuit 122 can include a group of variable capacitors 150 (e.g., voltage tunable capacitors) which are provided with the tuning signal(s) (e.g., a voltage bias signal(s)) through the use of the multiple bias (or feed) points 190. The group of variable capacitors 150 can be arranged in series, such as alternating pairs of adjacent top capacitors with pairs of adjacent bottom capacitors as illustrated in FIG. 1B. A first string of resistors 160 can be coupled with the group of variable capacitors 150 such that the first string of resistors applies a full DC bias voltage to each capacitor of the group of variable capacitors. In this embodiment, resistors of the first string of resistors 160 can each be connected between a top capacitor and a bottom capacitor of the group of variable capacitors 150. In one embodiment, nodes between selected pairs of resistors of the first string of resistors 160 can be chosen for the bias point positions according to various factors including insertion loss and/or the response time speed. A second string of resistors 165 can be coupled with the group of variable capacitors 150. The exemplary embodiments can provide the plurality of variable capacitors in any number of layers, such as a single layer, a pair of layers (e.g., top layer capacitor(s) and bottom capacitor layer(s)), or three or more layers.

The use of the group of variable capacitors 150 can reduce non-linear distortion in the tuning. The use of bias points 190 can enable achieving or otherwise satisfying thresholds for insertion loss and/or response time speed. In one embodiment, feed resistors 175 can be utilized where the resistance values for the feed resistor(s) is chosen based on various factors including the insertion loss and/or the response time speed criteria.

Figure 1C:
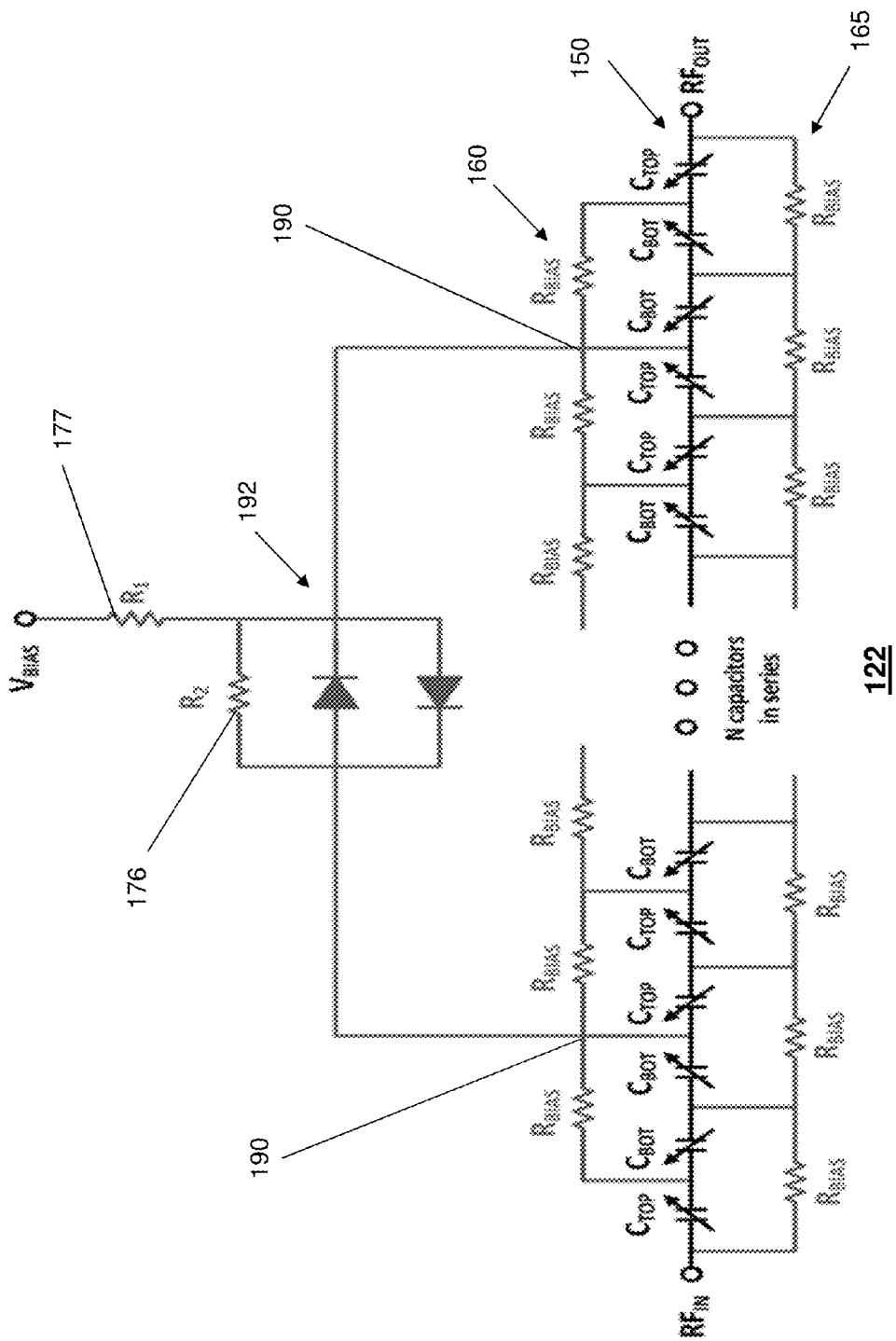

Referring additionally to FIG. 1C, in one embodiment the tunable circuit 122 can include the group of variable capacitors 150, the first string of resistors 160 and the second string of resistors 165. In this example, a combination of multiple bias points 190 and a diode sub-circuit of anti-parallel diodes 192 is utilized. The anti-parallel diodes 192 can be positioned between the bias points 190 so that during switching the diodes can provide a low impedance path to charge and discharge the group of variable capacitors 150 at a desired speed. Any number of anti-parallel diodes can be utilized, such as a first group of diodes being arranged in an anti-parallel configuration with a second group of diodes. In one embodiment, a parallel resistor 176 can be used that has a sufficient resistance to provide isolation at RF between the bias points 190 to reduce losses at high frequency and/or a series resistor. A series resistor 177 can also be utilized. The resistance values for the parallel and/or series resistors can be selected based on various factors, such as satisfying insertion loss and/or response time speed criteria. As described above, the particular location of the bias points 190 along the first string of resistors 160 can be selected based on various factors, such as satisfying insertion loss and/or response time speed criteria.

Figure 1D:
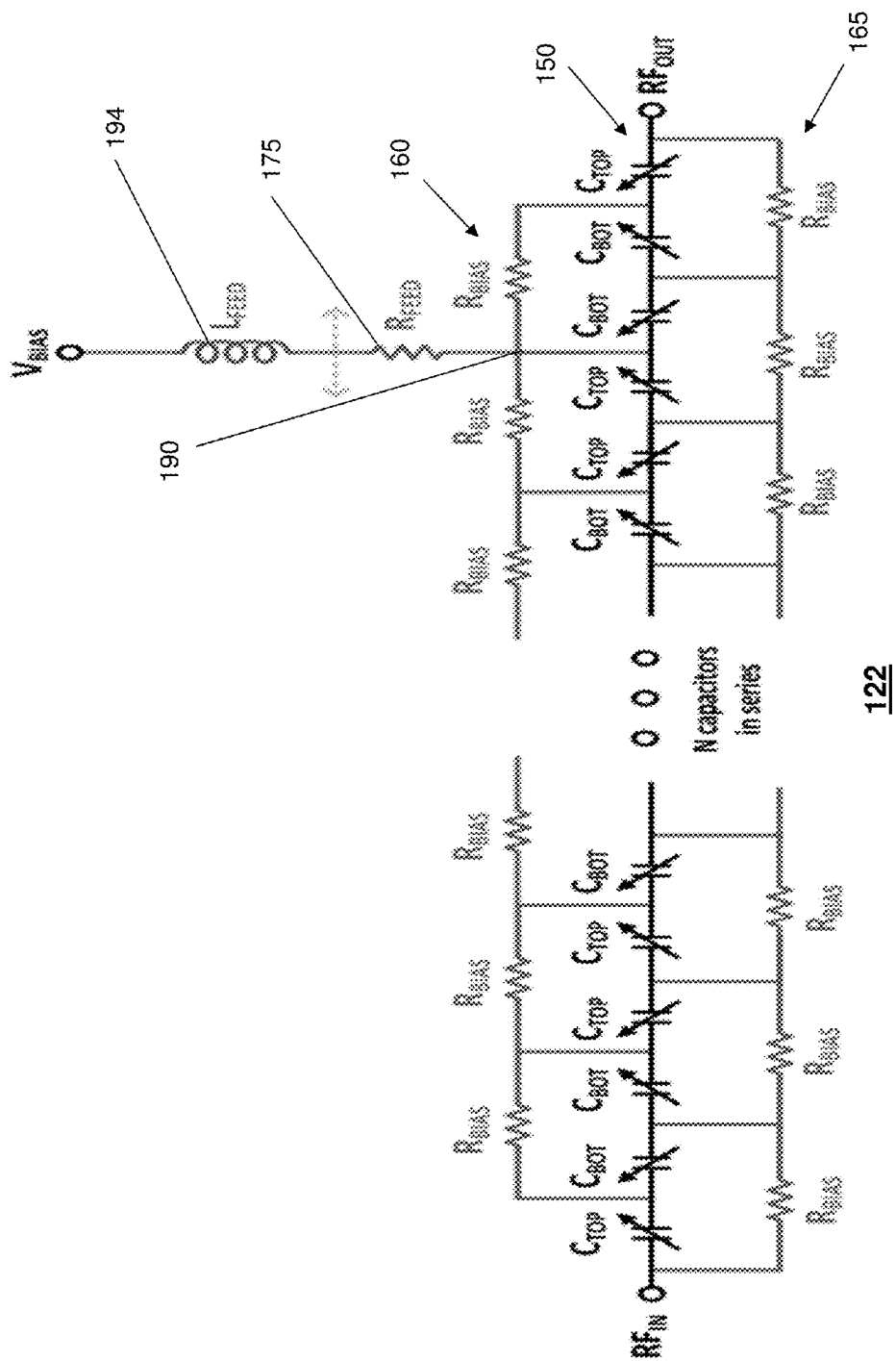

Referring additionally to FIG. 1D, in one embodiment the tunable circuit 122 can include the group of variable capacitors 150, the first string of resistors 160 and the second string of resistors 165. A choke (or feed) inductor 194 can be positioned between the bias point 190 and the voltage bias source to improve response time for the group of variable capacitors 150. In one embodiment, the choke inductor 194 can connect the voltage bias source with the bias point via a small or no feed resistance. For instance, an existing feed resistance can be reduced or eliminated when a choke inductor 194 is implemented. In other embodiments, the choke inductor 194 can be in series with a feed resistor 175. The resistance value for the feed resistor 175 (if utilized) and/or the inductance value of the choke inductor 194 can be selected based on various factors, such as satisfying insertion loss and/or response time speed criteria. In one or more embodiments, multiple choke inductors 194 (not shown), with or without feed resistors, can be used with multiple bias points 190 (not shown). As described above, the particular location of the bias points 190 along the first string of resistors 160 can be selected based on various factors, such as satisfying insertion loss and/or response time speed criteria. The choke inductor 194 (and the feed resistor 175 if utilized) can be implemented off-chip or on-chip.

Figure 1E:
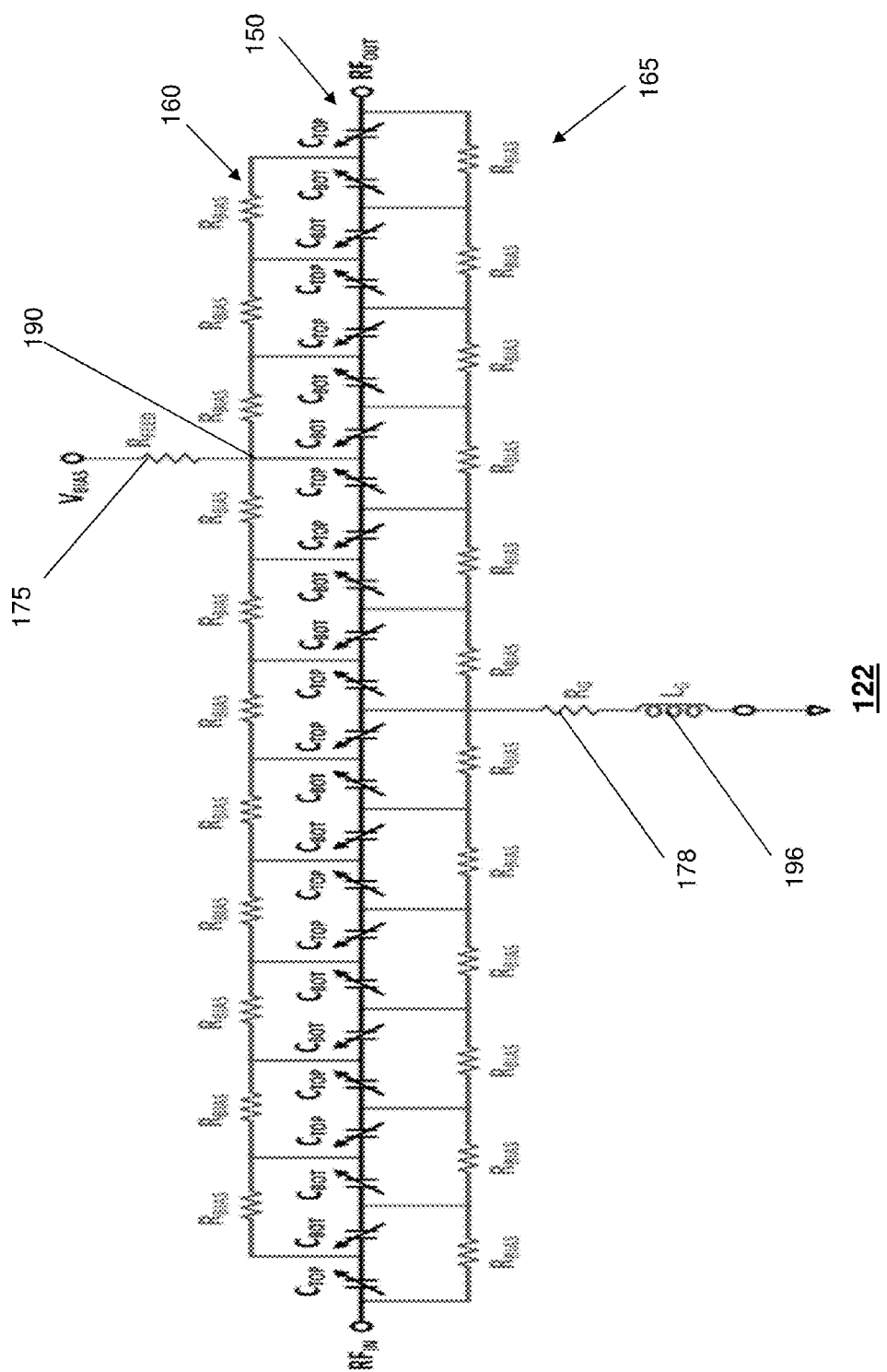

Referring additionally to FIG. 1E, in one embodiment the tunable circuit 122 can include the group of variable capacitors 150, the first string of resistors 160 and the second string of resistors 165. The second string of resistors 165 can be coupled with a DC ground via a ground inductor 196 to apply the DC ground to all of the capacitors of the group of variable capacitors 150 and thereby speed up the charge and discharge ground paths. This configuration can be used in conjunction with an RF input and/or an RF output being connected with a DC ground. In one embodiment, a ground resistor 178 can be placed in series with the ground inductor 178. The resistance value for the ground resistor 178 (if utilized) and/or the inductance value of the ground inductor 196 can be selected based on various factors, such as satisfying loss criteria. The ground resistor 178 and/or the ground inductor 196 can be provided on-chip or off-chip. In one or more embodiments, multiple ground connections using ground inductors 196 (with or without ground resistors 178) can be used.

It should be understood that various combinations of the multiple bias points 190, the anti-parallel diodes 192, the choke inductor 194 and/or the ground inductor 196 can be utilized to achieve various performance criteria, such as criteria based on insertion loss and/or response time speed.

FIG. 2 depicts an illustrative embodiment of a portion of the wireless transceiver 102 of the communication device 100 of FIG. 1. In GSM applications, the transmit and receive portions of the transceiver 102 can include amplifiers 201, 203 coupled to a tunable matching network 202 that is in turn coupled to an impedance load 206. The tunable matching network 202 can include all or a portion of the tuning circuit 122 of FIG. 1, such as variable capacitors, multiple bias points 190, anti-parallel diodes 192, choke inductor(s) 194 and/or ground inductor(s) 196, to enable high linearity tuning while satisfying performance criteria such as insertion loss thresholds and/or response time speed. The impedance load 206 in the present illustration can be an antenna as shown in FIG. 1 (herein antenna 206). A transmit signal in the form of a radio frequency (RF) signal (TX) can be directed to the amplifier 201 which amplifies the signal and directs the amplified signal to the antenna 206 by way of the tunable matching network 202 when switch 204 is enabled for a transmission session. The receive portion of the transceiver 102 can utilize a pre-amplifier 203 which amplifies signals received from the antenna 206 by way of the tunable matching network 202 when switch 204 is enabled for a receive session. Other configurations of FIG. 2 are possible for other types of cellular access technologies such as CDMA, UMTS, LTE, and so forth. These undisclosed configurations are applicable to the subject disclosure.

Figure 3:
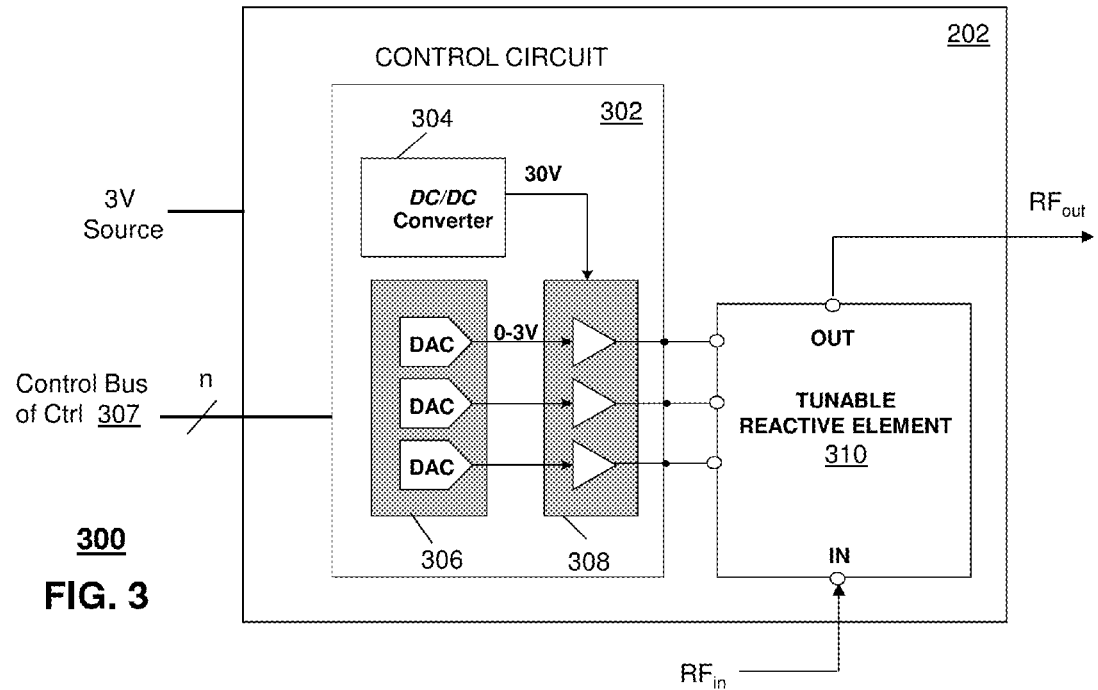
FIGS. 3-6 depict illustrative embodiments of a tunable matching network of the transceiver of FIG. 2.
Figure 4:
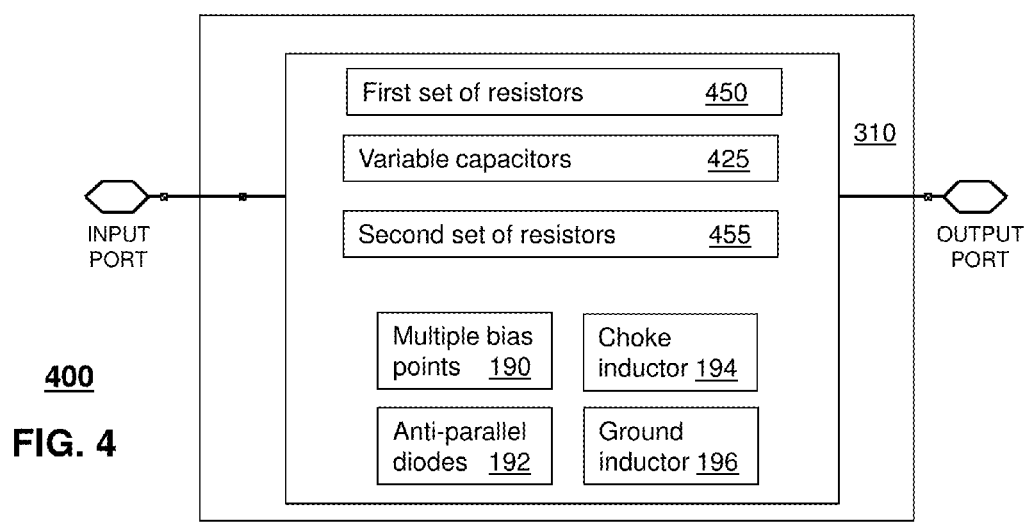

FIGS. 3-4 depict illustrative embodiments of the tunable matching network 202 of the transceiver 102 of FIG. 2. In one embodiment, the tunable matching network 202 can comprise a control circuit 302 and a tunable reactive element 310. The control circuit 302 can comprise a DC-to-DC converter 304, one or more digital to analog converters (DACs) 306 and one or more corresponding buffers 308 to amplify the voltage generated by each DAC. The amplified signal can be fed to a circuit that can include one or more of variable capacitors 425, a first set of resistors 450 (e.g., a first string of resistors), a second set of resistors 455 (e.g., a second string of resistors), multiple bias points 190, anti-parallel diodes 192, choke inductor(s) 194 or ground inductor(s) 196 such as shown in FIG. 4, which depicts a possible circuit configuration for the tunable reactive element 310. In this illustration, the variable capacitors 425 can be voltage tunable capacitors that enable high linearity tunability of the reactance of the components. One embodiment of the variable capacitors 425 can utilize voltage or current tunable dielectric materials. The tunable dielectric materials can utilize, among other things, a composition of barium strontium titanate (BST). Other embodiments can utilize variable capacitors that include semiconductor varactors, and/or micro-electromechanical systems (MEMS) technology capable of mechanically varying the dielectric constant of a capacitor. Other present or next generation methods or material compositions that result in a voltage or current tunable reactive element are applicable to the subject disclosure for use by the tunable reactive element 310 of FIG. 3.

The DC-to-DC converter 304 can receive a DC signal such as 3 volts from the power supply 114 of the communication device 100 in FIG. 1. The DC-to-DC converter 304 can use technology to amplify a DC signal to a higher range (e.g., 30 volts) such as shown. The controller 106 can supply digital signals to each of the DACs 306 by way of a control bus 307 of "n" or more wires or traces to individually control the capacitance of tunable capacitors 404-408, thereby varying the collective reactive impedance of the tunable matching network 202. The control bus 307 can be implemented with a two-wire serial bus technology such as a Serial Peripheral Interface (SPI) bus (referred to herein as SPI bus 307). With an SPI bus 307, the controller 106 can transmit serialized digital signals to configure each DAC in FIG. 3. The control circuit 302 of FIG. 3 can utilize digital state machine logic to implement the SPI bus 307, which can direct digital signals supplied by the controller 106 to the DACs to control the analog output of each DAC, which is then amplified by buffers 308. In one embodiment, the control circuit 302 can be a stand-alone component coupled to the tunable reactive element 310. In another embodiment, the control circuit 302 can be integrated in whole or in part with another device such as the controller 106.

Although the tunable reactive element 310 is shown in a unidirectional fashion with an RF input and RF output, the RF signal direction is illustrative and can be interchanged. Additionally, either port of the tunable reactive element 310 can be connected to a feed point of the antenna 206, a structural element of the antenna 206 in an on-antenna configuration, or between antennas for compensating mutual coupling when diversity antennas are used, or when antennas of differing wireless access technologies are physically in close proximity to each other and thereby are susceptible to mutual coupling. The tunable reactive element 310 can also be connected to other circuit components of a transmitter or a receiver section such as filters, amplifiers, and so on, to control operations thereof.

Figure 6:
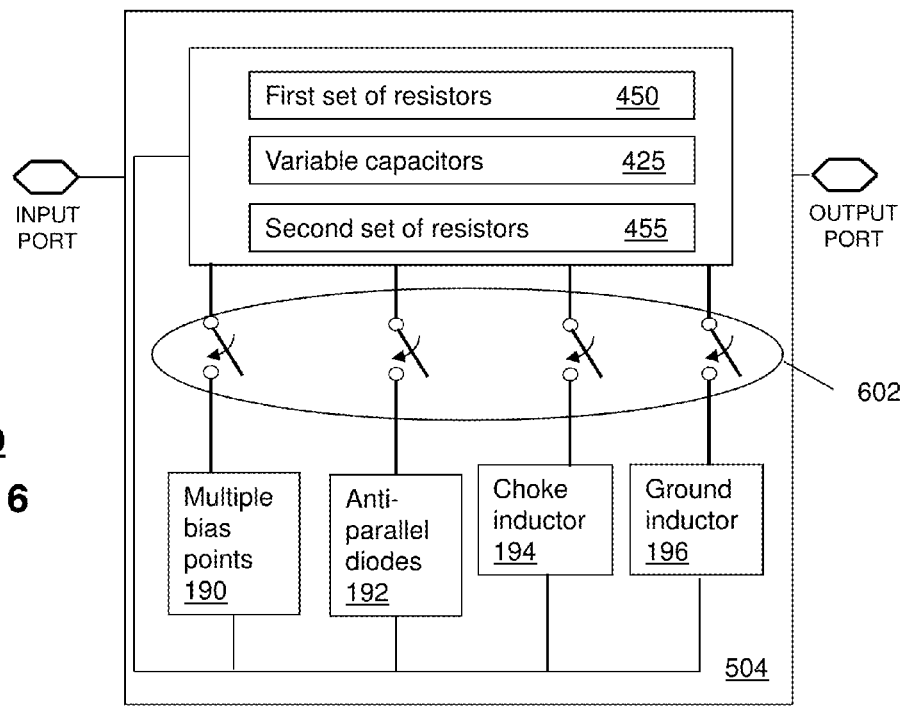

In another embodiment, the tunable matching network 202 of FIG. 2 can comprise a control circuit 502 in the form of a decoder and a tunable reactive element 504 comprising the variable capacitors 425 and the first and second set of resistors 450, 455 along with switchable biasing and grounding components (e.g., multiple bias points 190, anti-parallel diodes 192, choke inductor(s) 194 and/or ground inductor(s) 196) such as shown in FIG. 6. In this embodiment, the controller 106 can supply the control circuit 402 signals via the SPI bus 307, which can be decoded with Boolean or state machine logic to individually enable or disable the switching elements 602. The switching elements 602 can be implemented with semiconductor switches, MEMS, or other suitable switching technology. In one embodiment, by enabling and disabling (alone or in combination) the biasing and/or grounding components of FIG. 6 utilizing the switching elements 602, the insertion loss and/or the response time speed can be dynamically controlled, including making adjustments during a communication session such as based on measured operational parameter(s) and/or use cases.

Figure 5:
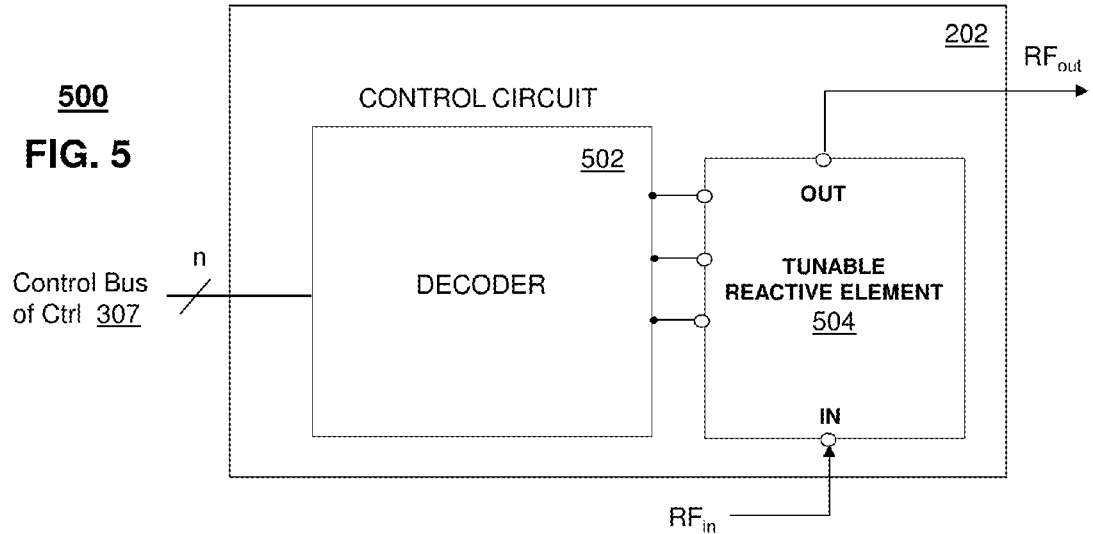

The tunable reactive elements 310 and 504 of FIGS. 3 and 5, respectively, can be used with various circuit components of the transceiver 102 to enable the controller 106 to manage performance factors such as, for example, but not limited to, transmit power, transmitter efficiency, receiver sensitivity, power consumption of the communication device 100, frequency band selectivity by adjusting filter passbands, linearity and efficiency of power amplifiers, SAR requirements, among other operational parameters.

Figure 8:
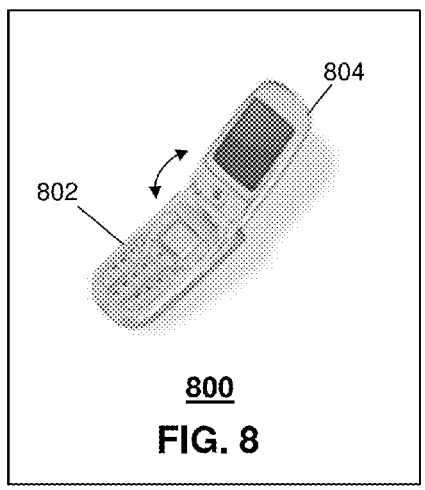
FIGS. 8-11 depict illustrative physical and operational use cases of a communication device.

FIG. 7 depicts an illustration of a look-up table stored in memory, which can be indexed by the controller 106 of the communication device 100 of FIG. 1 according to physical and/or functional use cases of the communication device 100. The desired tuning state can include values for the biasing signals and/or capacitance values to be employed for tuning of the variable capacitors, such as variable capacitors 425. A physical use case can represent a physical state of the communication device 100, while a functional use case can represent an operational state of the communication device 100. For example, for a flip phone 800 of FIG. 8, an open flip can represent one physical use case, while a closed flip can represent another physical use case. In a closed flip state (i.e., bottom and top flips 802-804 are aligned), a user is likely to have his/her hands surrounding the top flip 804 and the bottom flip 802 while holding the phone 800, which can result in one range of load impedances experienced by an internal or retrievable antenna (not shown) of the phone 800. The range of load impedances of the internal or retrievable antenna can be determined by empirical analysis.

With the flip open a user is likely to hold the bottom flip 802 with one hand while positioning the top flip 804 near the user's ear when an audio system of the phone 800, such audio system 112 of FIG. 1, is set to low volume, and voice channel is active. If, on the other hand, the audio system 112 is in speakerphone mode, it is likely that the user is positioning the top flip 804 away from the user's ear. In these arrangements, different ranges of load impedances can be experienced by the internal or retrievable antenna, which can be analyzed empirically. The low and high volume states of the audio system 112, as well as, a determination that a voice channel is active, illustrates varying functional use cases.

Figure 9:
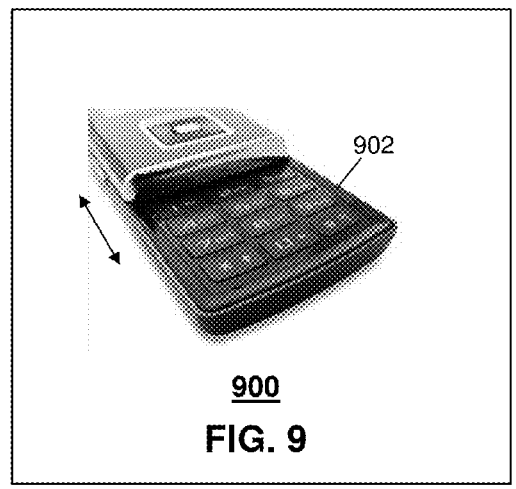
Figure 10:
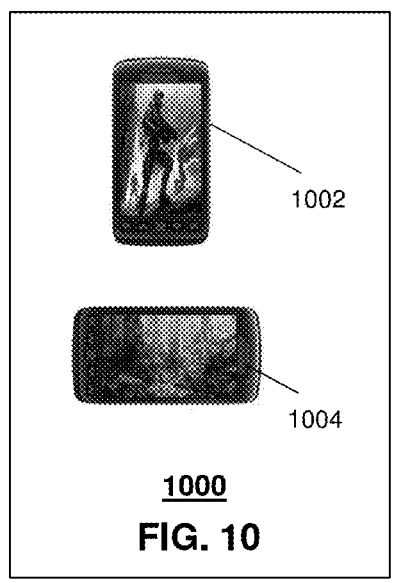
Figure 11:
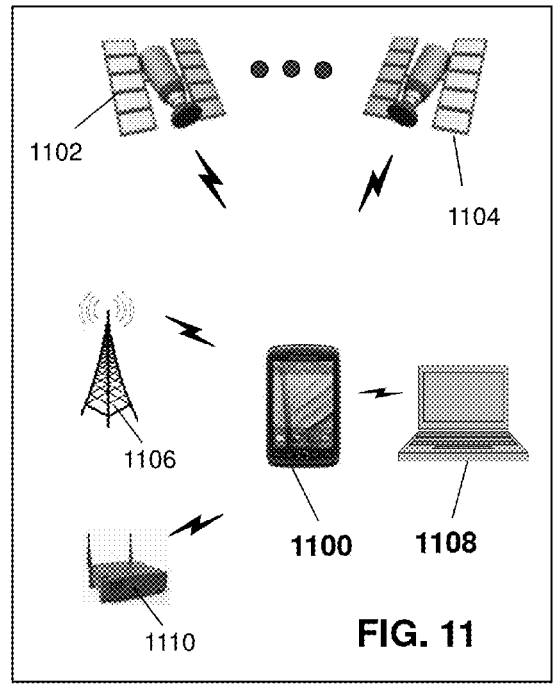

For a phone 900 with a slideable keypad 902 (illustrated in FIG. 9), the keypad in an outward position can present one range of load impedances of an internal antenna, while the keypad in a hidden position can present another range of load impedances, each of which can be analyzed empirically. For a smartphone 1000 (illustrated in FIG. 10) presenting a video game, an assumption can be made that the user is likely to hold the phone away from the user's ear in order to view the game. Placing the smartphone 1000 in a portrait position 1002 can represent one physical and operational use case, while utilizing the smartphone 1000 in a landscape position 1004 presents another physical and operational use case.

The number of hands and fingers used in the portrait mode may be determined by the particular type of game being played by the user. For example, a particular video game may require a user interface where a single finger in portrait mode may be sufficient for controlling the game. In this scenario, it may be assumed that the user is holding the smartphone 1000 in one hand in portrait mode and using a finger with the other. By empirical analysis, a possible range of impedances of the internal antenna(s) of the communication device can be determined when using the video game in portrait mode. Similarly, if the video game selected has a user interface that is known to require two hands in landscape mode, another estimated range of impedances of the internal antenna can be determined empirically.

A multimode phone 1100 capable of facilitating multiple access technologies such as GSM, CDMA, LTE, WiFi, GPS, and/or Bluetooth in two or more combinations can provide additional insight into possible ranges of impedances experienced by two or more internal antennas of the multimode phone 1100. For example, a multimode phone 1100 that provides GPS services by processing signals received from a constellation of satellites 1102, 1104 can be empirically analyzed when other access technologies are also in use. Suppose, for instance, that while navigation services are enabled, the multimode phone 1100 is facilitating voice communications by exchanging wireless messages with a cellular base station 1106. In this state, an internal antenna of the GPS receiver may be affected by a use case of a user holding the multimode phone 1100 (e.g., near the user's ear or away from the user's ear). The effect on the GPS receiver antenna and the GSM antenna by the user's hand position can be empirically analyzed.

Suppose in another scenario that the antenna of a GSM transceiver is in close proximity to the antenna of a WiFi transceiver. Further assume that the GSM frequency band used to facilitate voice communications is near the operational frequency of the WiFi transceiver. Also assume that a use case for voice communications may result in certain physical states of the multimode phone 1100 (e.g., slider out), which can result in a probable hand position of the user of the multimode phone 1100. Such a physical and functional use case can affect the impedance range of the antenna of the WiFi transceiver as well as the antenna of the GSM transceiver.

A close proximity between the WiFi and GSM antennas and the near operational frequency of the antennas may also result in cross-coupling between the antennas. Mutual or cross-coupling under these circumstances can be measured empirically. Similarly, empirical measurements of the impedances of other internal antennas can be measured for particular physical and functional use configurations when utilizing Bluetooth, WiFi, Zigbee, or other access technologies in peer-to-peer communications with another communication device 1108 or with a wireless access point 1110. In diversity designs such as multiple-input and multiple output (MIMO) antennas, physical and functional use cases of a communication device can be measured empirically to determine how best to configure a tunable compensation circuit 122 such as shown in FIG. 1.

The number of physical and functional use cases of a communication device 100 can be substantial when accounting for combinations of access technologies, frequency bands, antennas of different access technologies, antennas configured for diversity designs, and so on. These combinations, however, can be empirically analyzed to determine load impedances of the antenna(s), mutual coupling between them, and the effects on transmitter and receiver performance metrics. Mitigation strategies to reduce mutual coupling, counter the effect of varying load impedances, and to improve other performance metrics of the transceiver 102 can also be determined empirically. The empirical data collected and corresponding mitigation strategies can be recorded in the look-up table of FIG. 7 and indexed according to combinations of physical and functional use cases detected by the communication device 100. The information stored in the look-up table can be used in open-loop RF tuning applications to initialize tunable circuit components of the transceiver 102, as well as, tuning algorithms that control operational aspects of the tunable circuit components.

Figure 12:
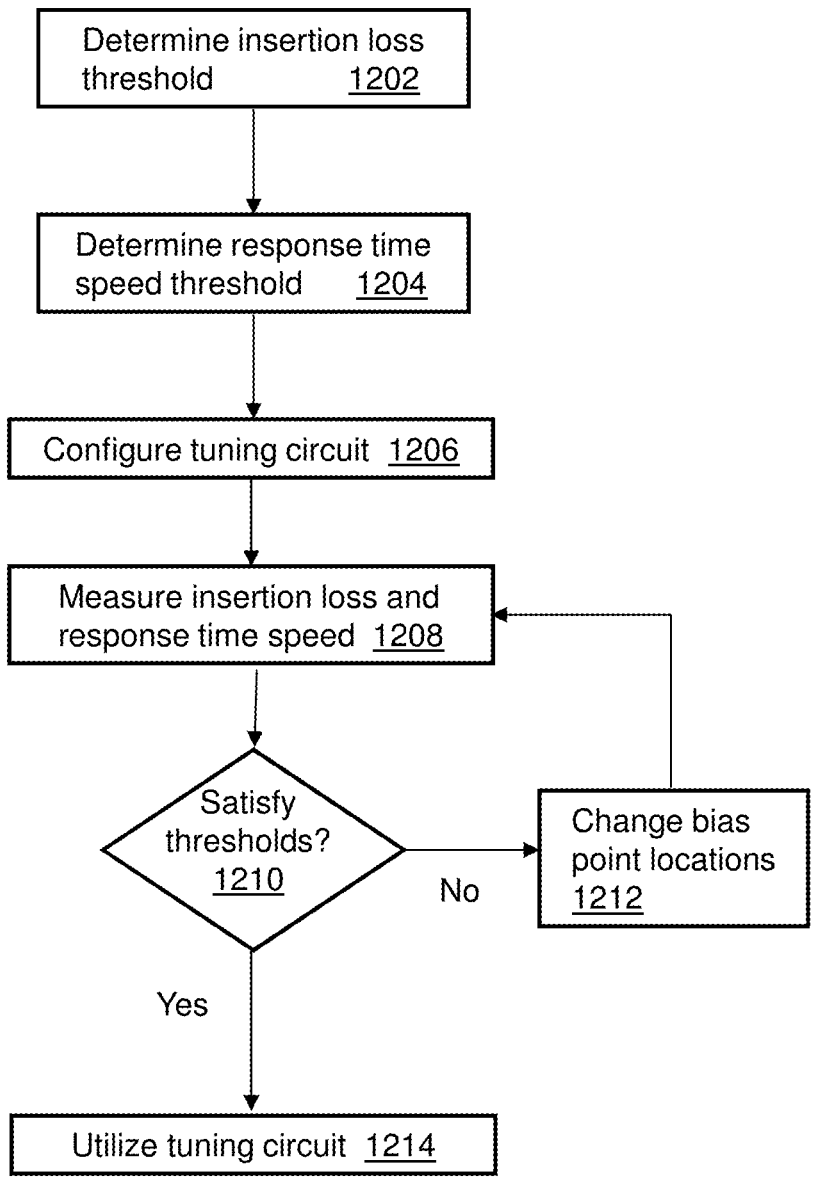
FIG. 12 depicts an exemplary method associated with the embodiments of FIGS. 1-11.

FIG. 12 depicts an illustrative method 1200 for providing a high linearity tuning device or component, such as tuning circuit 122. Method 1200 can begin with step 1202 in which a desired insertion loss for a matching network is determined. The determination of the desired insertion loss can be based on various factors, such as standards for particular access technologies, service provider quality of service requirements, and so forth. At 1204, a desired response time speed for a matching network can be determined. The determination of the desired response time speed can be based on various factors, such as standards for particular access technologies, service provider quality of service requirements, and so forth.

At 1206, a tuning circuit can be configured by connecting a first string of resistors and a second string of resistors with a plurality of variable capacitors connected in series. The first string of resistors can be configured for applying a bias voltage to each variable capacitor of the plurality of capacitors. The second string of resistors can be configured for providing a DC ground to each variable capacitor of the plurality of capacitors. At 1208, the insertion loss and the response time speed for the tuning circuit can be measured or otherwise determined. At 1210, a determination can be made as to whether the insertion loss and the response time speed satisfy the insertion loss threshold and the response time speed threshold. If the thresholds are not satisfied then method 1200 can proceed to 1212 where the bias point locations are changed (e.g., selecting a new node between pairs of adjacent resistors in the first string of resistors). The changing of the bias point locations can be performed in various ways, such as changing one bias point while maintaining the other bias point(s) in its previous position, changing both bias points, or other iterative techniques. The insertion loss and response time speed can be measured again at 1208 for the new bias point location(s) to determine if the thresholds are satisfied. Once the thresholds are satisfied then method 1200 proceeds to 1214 where the tuning circuit is ready for use.

In one embodiment, method 1200 can be a manufacturing process where the changing of bias point locations and satisfying of the thresholds is being performed to manufacture a particular device that includes the tuning circuit. In another embodiment, method 1200 can be performed by a device that includes the tuning circuit, where the changing of the bias point locations is via switches. In this example, the configuration of the tuning circuit at 1206 can represent enabling an already existing circuit in the device or enabling the circuit via a switch or other means. Continuing with this example, the determination of the insertion loss and response time speed thresholds can be based on information from various sources, such as a look-up table (e.g., thresholds indexed to access technologies, service provider specification, other operational parameters, and so forth) or from received information including thresholds that are communicated to the device by a base station.

In one embodiment, the configuration of the tuning circuit can include other components (utilized alone or in combination) to facilitate satisfying the insertion loss and/or response time speed thresholds, such as anti-parallel diodes, choke inductor(s), ground inductor(s) and so forth.

Upon reviewing the aforementioned embodiments, it would be evident to an artisan with ordinary skill in the art that said embodiments can be modified, reduced, or enhanced without departing from the scope of the claims described below. For example, the group of variable capacitors, which are connected with one or more of the biasing configurations and/or the grounding configurations described herein, can perform high linearity tuning for various devices or components such as matching networks, tunable antennas, tunable filters, and tunable power amplifiers. These tunable components can be part of a mobile communication device (e.g., a smart phone) or can be part of another device that utilizes a group of variable capacitors. The number of variable capacitors that are utilized in the group of variable capacitors 150 can vary, such as 4 variable capacitors, 8 variable capacitors, 24 variable capacitors, 48 variable capacitors, or more or less than 24 or 48 variable capacitors.

One or more of the exemplary embodiments illustrate a group of capacitors that are formed in as top and bottom capacitors (e.g., top and bottom layers), however, the exemplary embodiments can have a group of variable capacitors in any number of layers, such as a single layer of variable capacitors, or more than two layers of variable capacitors.

Other embodiments can be applied to the subject disclosure without departing from the scope of the claims described below.

It should be understood that devices described in the exemplary embodiments can be in communication with each other via various wireless and/or wired methodologies. The methodologies can be links that are described as coupled, connected and so forth, which can include unidirectional and/or bidirectional communication over wireless paths and/or wired paths that utilize one or more of various protocols or methodologies, where the coupling and/or connection can be direct (e.g., no intervening processing device) and/or indirect (e.g., an intermediary processing device such as a router).

Radio band information can be generally available or otherwise retrievable in communication devices, which provides the broadest definition of where in a frequency spectrum a communication device such as a handset is operating (e.g., transmitting). In communication systems (e.g., cellular systems), frequencies can be commonly allocated for usage in a block or range of frequencies. This block or range of frequencies is commonly known as a radio band. Multiple radio bands can be present in any given cellular system, and in any geographic location there can be multiple cellular systems present.

A radio channel can identify a discrete set of frequencies in a cellular system that contains the downlink (from base station to the handset) and uplink (from handset to base station) radio signals. Downlink is also referred to as Rx and uplink is also referred to as Tx. In most systems, such as WCDMA (Wideband Code Division Multiple Access), uplink and downlink can use separate frequencies that are separated by the duplex distance, which is the number of Hz separating the uplink and downlink paths. For other systems, such as TD-LTE (Time Division Long Term Evolution), the uplink and downlink can use the same frequency.

One or more of the exemplary embodiments can utilize radio band information, including only radio band information in some embodiments or radio band information in combination with other information (e.g., measured operational parameters), for antenna tuning. The exemplary embodiments can apply to various types of devices, including wireless handsets operating utilizing one or more of various communication protocols.

RF tuning based on limited information, such as only the radio band, can create a number of problems. In an ideal cellular system that employs RF tuning, the tuner would be set to match every frequency on which the radio receives or transmits, with the understanding that typically a single antenna is used for both Rx and Tx which requires the RF tuner to change tuning state as the RF signal on the antenna changes frequency. For half-duplex systems, such as GSM that would be for every Rx and Tx, including neighbor cells. In full-duplex systems, such as WCDMA where both Rx and Tx are present concurrently, the RF tuner has to change when the frequency changes for handoffs and neighbor cell monitoring, and additionally the tuning state has to be a duplex setting for Rx and Tx on a frequency between the Rx and Tx frequencies.

In order to perform RF tuning in such an ideal system, the entity controlling the tuner could require exact knowledge in real time of all relevant information pertaining to operating the tuner, such as the radio timing, radio band, radio channel, RF duplex information, and transmit state. Tuning based on limited information occurs when the entity controlling the tuner does not have all the information required to set the RF tuner to match an exact frequency at a given time. For example, real time channel information could be missing, in which case the tuner control entity could set the RF tuner based on information pertaining to the Radio Band only.

Transmit (Tx) and Receive (Rx) operations often cannot or are not tuned in real-time. This can result in or necessitate a broader duplex type tuning. Duplex tuning refers to where the tunable element for a particular sub-band or radio channel is tuned to a frequency between uplink and downlink; one tuning state can be used for both Rx and Tx in this case. In some systems that are full-duplex (concurrent uplink and downlink, such as WCDMA), duplex tuning is commonly used. Other systems that are half-duplex (uplink and downlink are not concurrent, such as GSM), the tuner can be tuned for both Rx and Tx.

Sub-band describes a grouping of frequencies (e.g., radio channels) consisting of one or more radio channels. In tuning applications, sub-dividing a radio band into multiple sub-bands can provide the advantage of being able to apply a particular tuning state to a small or smaller range of radio channels. Sub-bands can be used in conjunction with storage and application of calibration data in cellular handsets, providing a compromise between accuracy and amount of storage needed to hold said calibration data.

An example of a radio band is the GSM 900 band, in which the uplink frequencies can occupy the range 880.0 to 915.0 MHz and the downlink frequencies can occupy the range 925.0 to 960.0 MHz. The duplex spacing can be 45 MHz. The first channel can be channel 975 which has uplink at 880.2 MHz and downlink at 915.2 MHz. The last channel can be channel 124 which has uplink at 914.8 MHz and downlink at 959.8 MHz.

The GSM 900 band can, for example, be subdivided into 3 sub bands as follows: Sub band 1 ranging from channel 975 to channel 1023 (48 channels, 9.6 MHz wide), Sub Band 2 ranging from channel 0 to channel 66 (66 channels, 13.2 MHz wide), and sub band 3 ranging from channel 67 to channel 124 (57 channels, 11.4 MHz wide). This is an example of a radio band and sub-bands, and the present disclosure can include various configurations of radio bands and sub-bands.

Similar principles can be applied to other existing wireless access technologies (e.g., UMTS, etc.) as well as future generation access technologies.

Figure 13:
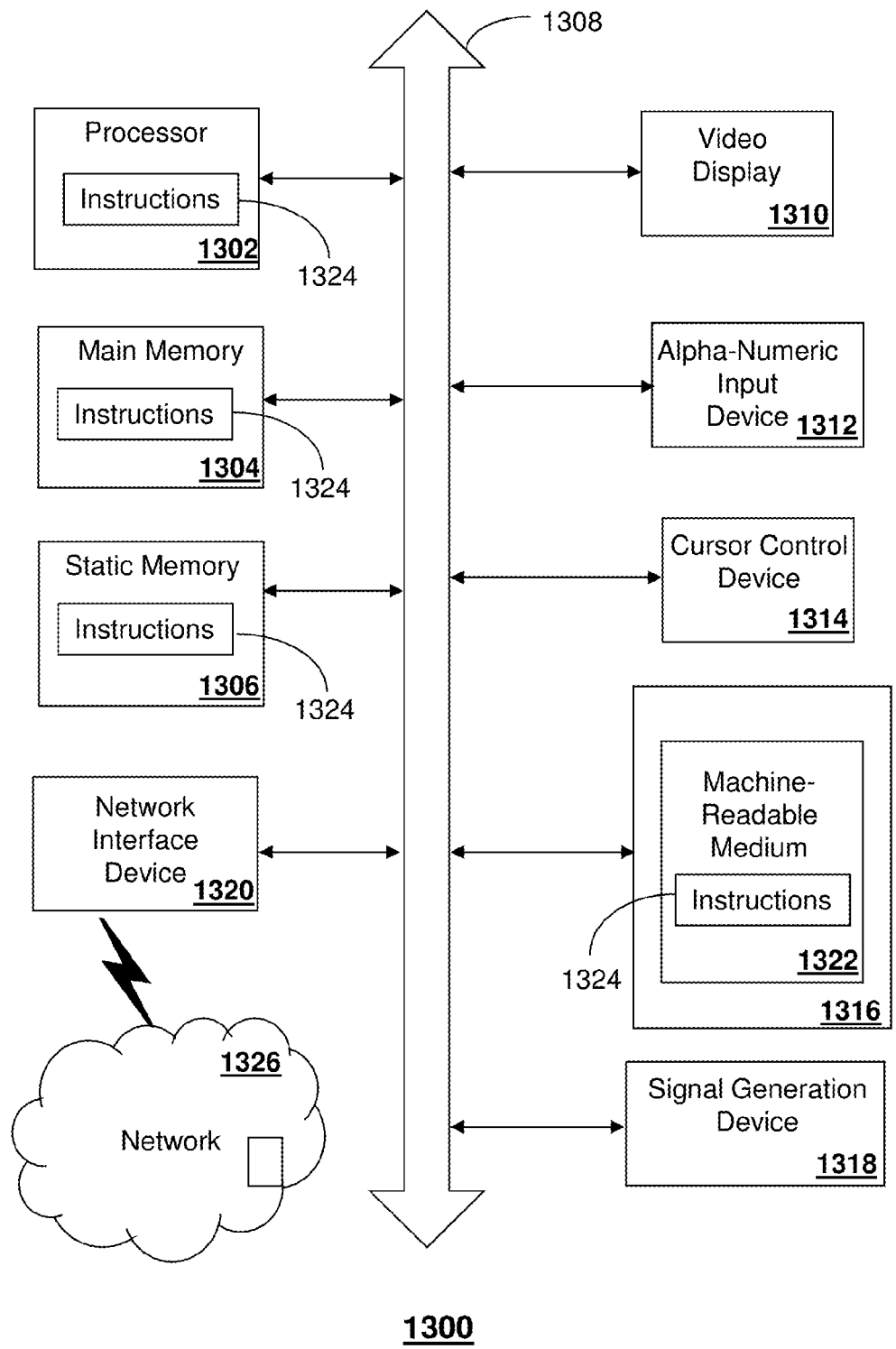
FIG. 13 depicts an illustrative diagrammatic representation of a machine in the form of a computer system within which a set of instructions, when executed, may cause the machine to perform any one or more of the methodologies disclosed herein.

FIG. 13 depicts an exemplary diagrammatic representation of a machine in the form of a computer system 1300 within which a set of instructions, when executed, may cause the machine to perform any one or more of the methods discussed above. One or more instances of the machine can operate, for example, as the communication device 100 of FIG. 1, the controller 106, the control circuit 302, and/or the decoder 502, for enabling high linearity tuning via one or more of multiple bias points, anti-parallel diodes, choke inductor(s) and/or ground inductors. In some embodiments, the machine may be connected (e.g., using a network 1326) to other machines. In a networked deployment, the machine may operate in the capacity of a server or a client user machine in server-client user network environment, or as a peer machine in a peer-to-peer (or distributed) network environment.

The machine may comprise a server computer, a client user computer, a personal computer (PC), a tablet PC, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 1300 may include a processor (or controller) 1302 (e.g., a central processing unit (CPU), a graphics processing unit (GPU, or both), a main memory 1304 and a static memory 1306, which communicate with each other via a bus 1308. The computer system 1300 may further include a display unit 1310 (e.g., a liquid crystal display (LCD), a flat panel, or a solid state display. The computer system 1300 may include an input device 1312 (e.g., a keyboard), a cursor control device 1314 (e.g., a mouse), a disk drive unit 1316, a signal generation device 1318 (e.g., a speaker or remote control) and a network interface device 1320. In distributed environments, the embodiments described in the subject disclosure can be adapted to utilize multiple display units 1310 controlled by two or more computer systems 1300. In this configuration, presentations described by the subject disclosure may in part be shown in a first of the display units 1310, while the remaining portion is presented in a second of the display units 1310.

The disk drive unit 1316 may include a tangible computer-readable storage medium 1322 on which is stored one or more sets of instructions (e.g., software 1324) embodying any one or more of the methods or functions described herein, including those methods illustrated above. The instructions 1324 may also reside, completely or at least partially, within the main memory 1304, the static memory 1306, and/or within the processor 1302 during execution thereof by the computer system 1300. The main memory 1304 and the processor 1302 also may constitute tangible computer-readable storage media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the methods described herein are intended for operation as software programs running on a computer processor. Furthermore, software implementations can include, but not limited to, distributed processing or component/object distributed processing, parallel processing, or virtual machine processing can also be constructed to implement the methods described herein.

While the tangible computer-readable storage medium 1322 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods of the subject disclosure.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth, WiFi, Zigbee), and long-range communications (e.g., WiMAX, GSM, CDMA, LTE) are contemplated for use by computer system 1300.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, can be used in the subject disclosure. In one or more embodiments, features that are positively recited can also be excluded from the embodiment with or without replacement by another component or step. The steps or functions described with respect to the exemplary processes or methods can be performed in any order. The steps or functions described with respect to the exemplary processes or methods can be performed alone or in combination with other steps or functions (from other embodiments or from other steps that have not been described). Less than all of the steps or functions described with respect to the exemplary processes or methods can also be performed in one or more of the exemplary embodiments. Further, the use of numerical terms to describe a device, component, step or function, such as first, second, third, and so forth, is not intended to describe an order or function unless expressly stated so. The use of the terms first, second, third and so forth, is generally to distinguish between devices, components, steps or functions unless expressly stated otherwise. Additionally, one or more devices or components described with respect to the exemplary embodiments can facilitate one or more functions, where the facilitating (e.g., facilitating access or facilitating establishing a connection) can include less than every step needed to perform the function or can include all of the steps needed to perform the function.

In one or more embodiments, a processor (which can include a controller or circuit) has been described that performs various functions. It should be understood that the processor can be multiple processors, which can include distributed processors or parallel processors in a single machine or multiple machines. The processor can include virtual processor(s). The processor can include a state machine, application specific integrated circuit, and/or programmable gate array including a Field PGA, or state machine. In one or more embodiments, when a processor executes instructions to perform "operations", this can include the processor performing the operations directly and/or facilitating, directing, or cooperating with another device or component to perform the operations.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A mobile communication device, comprising:
    a transceiver;
    an antenna coupled with the transceiver; and
    a matching network coupled with the transceiver and the antenna, wherein the matching network comprises a plurality of variable capacitors connected in series, a first string of resistors for applying a bias voltage to each variable capacitor of the plurality of capacitors, and a second string of resistors for providing a DC ground to each variable capacitor of the plurality of capacitors, wherein the first string of resistors has a first bias point coupled to a voltage bias source via a first feed inductor, the first bias point corresponding to a node on the first string of resistors between selected adjacent resistors of the first string of resistors, and wherein a location of the first bias point along the first string of resistors is adjustable via a switching circuit that changes the location of the first bias point to a different node on the first string of resistors.

2. The mobile communication device of claim 1, wherein the first string of resistors has one or more second bias points coupled to the voltage bias source via one or more second feed inductors, respectively.

3. The mobile communication device of claim 2, wherein the plurality of variable capacitors is at least twenty four variable capacitors, and wherein the coupling of the first bias point and the one or more second bias points to the voltage bias source is via multiple outputs of a digital-to-analog converter, respectively.

4. The mobile communication device of claim 1, wherein the first bias point is coupled to the voltage bias source via the first feed inductor without using a feed resistor.

5. The mobile communication device of claim 1, wherein the matching network comprises at least one ground inductor coupled with the second string of resistors.

6. The mobile communication device of claim 5, wherein the matching network comprises a ground resistor coupled in series with the at least one ground inductor.

7. The mobile communication device of claim 1, wherein the plurality of variable capacitors includes alternating pairs of top variable capacitors and pairs of bottom variable capacitors, and wherein each second resistor of the second string of resistors is in parallel with a pair of adjacent top and bottom variable capacitors.

8. The mobile communication device of claim 1, wherein the plurality of variable capacitors includes alternating pairs of top variable capacitors and pairs of bottom variable capacitors, and wherein each first resistor of the first string of resistors is in parallel with a pair of adjacent top variable capacitors or with a pair of adjacent bottom variable capacitors.

9. The mobile communication device of claim 1, comprising:
a memory storing computer instructions; and
a processor coupled to the memory and the matching network, wherein the processor, responsive to executing the computer instructions, performs operations comprising:
providing biasing signals to the voltage bias source to enable adjusting of the plurality of variable capacitors via the first bias point to perform impedance matching, wherein the biasing signals are determined from at least one of a measured operational parameter of the mobile communication device or a determined use case of the mobile communication device.

10. A device, comprising:
a plurality of variable capacitors connected in series;
a first set of resistors for applying a bias voltage to each variable capacitor of the plurality of variable capacitors; and
a second set of resistors for providing a DC ground to each variable capacitor of the plurality of variable capacitors,
wherein the first set of resistors has one or more bias points, and
wherein the one or more bias points are coupled to a voltage bias source via one or more feed inductors, respectively,
wherein the one or more bias points are first and second bias points that are each coupled to the voltage bias source via a respective one of the one or more feed inductors and further comprising:
an anti-parallel diode sub-circuit located between the first and second bias points, wherein a feed resistor is positioned in parallel with the anti-parallel diode sub-circuit, and wherein the anti-parallel diode sub-circuit includes a first diode that is in an anti-parallel configuration with a second diode; and
a switching circuit operably coupled with the first set of resistors and with the one or more bias points, wherein the first and second bias points respectively correspond to first and second nodes between selected adjacent resistors of the first set of resistors, wherein a location of at least one of the first and second bias points along the first set of resistors is adjustable via the switching circuit that changes the location of the at least one of the first and second bias points between different pairs of resistors of the first set of resistors.

11. The device of claim 10, comprising at least one ground inductor coupled with the second set of resistors.

12. The device of claim 11, comprising a ground resistor coupled in series with the at least one ground inductor.

13. The device of claim 10, wherein the plurality of variable capacitors include alternating pairs of top variable capacitors and pairs of bottom variable capacitors, and wherein each second resistor of the second set of resistors is in parallel with a pair of adjacent top and bottom variable capacitors.

14. The device of claim 10, wherein the plurality of variable capacitors include alternating pairs of top variable capacitors and pairs of bottom variable capacitors, and wherein each first resistor of the first set of resistors is in parallel with a pair of adjacent top variable capacitors or with a pair of adjacent bottom variable capacitors.

15. A method, comprising:
determining, by a system including a processor, a desired insertion loss associated with a tunable component;
determining, by the system, a desired response time speed associated with the tunable component;
connecting a first string of resistors and a second string of resistors with a plurality of variable capacitors connected in series, wherein the first string of resistors is configured for applying a bias voltage to each variable capacitor of the plurality of capacitors, and wherein the second string of resistors is configured for providing a DC ground to each variable capacitor of the plurality of capacitors; and
connecting a voltage bias source to the first string of resistors at first and second bias points, the first and second bias points corresponding respectively to first and second nodes on the first string of resistors between selected adjacent resistors of the first string of resistors, wherein positioning of the first and second bias points along the first string of resistors is adjusted via a switching circuit based on the desired insertion loss and the desired response time speed, wherein the positioning of the first and second bias points changes between different pairs of resistors of the first string of resistors.

16. The method of claim 15, wherein the connecting of the voltage bias source to the first string of resistors is via feed resistors, wherein the plurality of variable capacitors include alternating pairs of top variable capacitors and pairs of bottom variable capacitors, wherein each second resistor of the second string of resistors is in parallel with a pair of adjacent top and bottom variable capacitors, and wherein each first resistor of the first string of resistors is in parallel with a pair of adjacent top variable capacitors or with a pair of adjacent bottom variable capacitors.

17. The method of claim 15, wherein the connecting of the voltage bias source to the first string of resistors is via an anti-parallel pair of diodes that is located between the first and second bias points.

18. The method of claim 15, wherein the connecting of the voltage bias source to the first string of resistors is via a feed inductor without utilizing a feed resistor.

* * * * *